Feb. 3, 1970 J. J. KLINIKOWSKI Re. 26,780
ELECTRONIC DIODE MATRIX DECODER CIRCUITS
Original Filed March 23, 1964
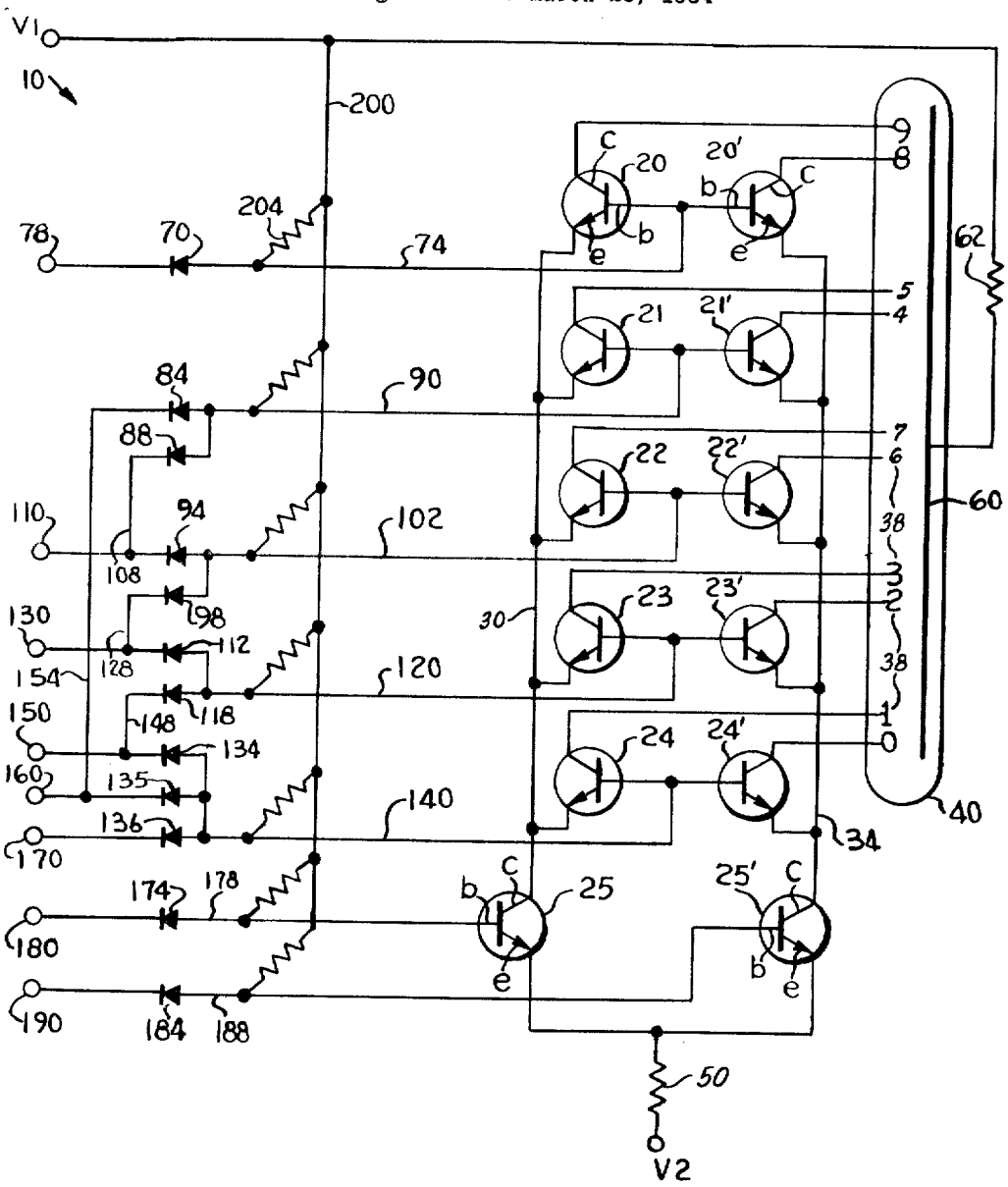
INVENTOR.
JAMES J. KLINIKOWSKI
BY
Robert G. Green
ATTORNEY United States Patent Office Re. 26,780
Reissued Feb. 3, 1970

26,780
ELECTRONIC DIODE MATRIX DECODER CIRCUITS

James J. Klinikowski, Lehigh County, Pa., assignor to Burroughs Corporation, Detroit, Mich., a corporation of Michigan Original No. 3,309,695, dated Mar. 14, 1967, Ser. No. 353,845, Mar. 23, 1964. Application for reissue Mar. 12, 1969, Ser. No. 806,747
Int. Cl. G06f *5/00*
U.S. Cl. 340—347 7 Claims

Matter enclosed in heavy brackets [ ] appears in the original patent but forms no part of this reissue specification; matter printed in italics indicates the additions made by reissue.

*ABSTRACT OF THE DISCLOSURE*

*A signal decoder circuit including five pairs of display switching devices coupled to decimal numerical display means and two control switching devices, each of which controls the operation of five of the display switching devices. Binary-coded decimal signal bits are coupled through an array of AND gates and a diode matrix to the display switching devices and to the control switching devices. The circuit processes each combination of input signal bits and causes one control switching device to select and operate one display switching device which operates the decimal display means corresponding to the particular combination of signal bits.*

This invention relates to electronic decoder circuits and, particularly to a diode matrix decoder circuit usable to convert several different binary codes to decimal code.

Electronic decoder circuits using diode matrices are known for converting binary-coded decimal signals to pure decimal signals. However, none of these circuits is what may be termed a "universal" circuit, that is, these circuits cannot be used to decode signals of more than one code system without relatively elaborate modification of the diode matrix and associated circuitry for each code system.

Accordingly, the objects of the present invention are directed toward the provision of an improved electronic decoder circuit using a relatively simple diode matrix and adaptable to decode signals in several different code systems without modification of the diode matrix.

A circuit embodying the invention is particularly useful for decoding biquinary code systems and includes, in brief, five pairs of transistors connected together in biquinary fashion, that is, in two groups of five, with one transistor of each pair connected in a group. In addition, a separate auxiliary control transistor is provided to control the operation of each group of five transistors. All of the transistors, including the control transistors, are coupled to a diode matrix in which the diodes are interconnected to provide a plurality of AND gates. A plurality of input terminals are coupled to the AND gates and the signal bits of various binary-coded signals are adapted to be coupled in proper order to selected ones of these terminals so that the proper decimal output is provided for each code input.

In the drawing, the single figure is a schematic representation of a decoder circuit embodying the invention.

A circuit 10 embodying the invention includes five pairs of transistors including the pairs 20 and 20', 21 and 21', 22 and 22', 23 and 23', 24 and 24'. In addition, the circuit includes a pair of control transistors 25 and 25'. Each transistor includes base, emitter, and collector electrodes b, e, and c, respectively. The control transistor 25 has its output or collector electrode coupled through lead

30 to the emitter electrode of one transistor of each pair, for example, transistors 20 to 24. Similarly, the collector or output electrode of control transistor 25' is coupled by lead 34 to the emitter electrode of each of the other transistors of each pair.

The collector or output electrode of each transistor 20 to 24 and 20' to 24' is connected to one of the glow cathodes 38 of a multi-cathode glow tube 40 such as the type 6844A tube to provide a visible display of the decimal output of the circuit 10. In the circuit shown, and for 8–4–2–1 code to be described, the collectors of transistors 24 and 24' are connected to the cathode numerals "0" and "1," respectively; the collectors of transistors 23 and 23' are connected to the cathode numerals "2" and "3," respectively; the collector electrodes of transistors 22 and 22' are connected to cathode numerals "6" and "7," respectively; the collector electrodes of transistors 21 and 21' are connected to cathode numerals "4" and "5," respectively; and the collector electrodes of transistors 20 and 20' are connected to cathode numerals "8" and "9," respectively.

The emitter electrodes of control transistors 25 and 25' are coupled together and through a suitable resistor 50 to a power source V2 such that the emitters of these transistors are at a potential between logical 1 and logical 0, as defined below.

The tube 40 also includes an anode electrode 60 which is coupled through a resistor 62 to a positive D.C. power source V1.

A diode matrix decoding network, embodying the invention, for converting binary-coded decimal information to pure decimal information is coupled to the pairs of transistors to perform the required conversion or decoding operation. The decoding circuit includes a first diode 70, oriented as shown and having its anode coupled through lead 74 to the base electrodes of transistors 20 and 20'. The cathode of diode 70 is provided with an input terminal 78. Diodes 84 and 88 comprise a two-part AND gate and have their anodes connected through lead 90 to the base electrodes of transistors 21 and 21'. Diodes 94 and 98 comprise a two-part AND gate and have their anodes connected through lead 102 to the base electrodes of transistors 22 and 22'. The cathodes of diodes 88 and 94 are connected together by lead 108 to form a sub-pair of diodes, and lead 108 is provided with an input terminal 110. Diodes 112 and 118 comprise another two-part AND gate and have their anodes connected through lead 120 to the base electrodes of transistors 23 and 23'. The cathodes of diodes 98 and 112 are connected together by a lead 128 to form a sub-pair of diodes, and lead 128 is provided with an input terminal 130.

The circuit also includes three diodes 134, 135, and 136 which comprise a three-part AND gate and have their anodes coupled through lead 140 to the base electrodes of transistors 24 and 24'. The cathodes of diodes 118 and 134 are connected together by a lead 148 to form a sub-pair of diodes, and the lead 148 is provided with an input terminal 150. The cathode of diode 84 is coupled to the cathode of diode 135 by lead 154 to form another sub-pair of diodes, and lead 154 is provided with an input terminal 160. The cathode of diode 136 is provided with an input terminal 170. A single diode 174 has its anode coupled by lead 178 to the base electrode of transistor 25, and its cathode is provided with an input terminal 180. Finally, a single diode 184 has its anode coupled by lead 188 to the base electrode of control transistor 25', and its cathode is provided with an input terminal 190.

It can be seen that the diode matrix includes eight input lines coupled to the cathodes of the diodes and seven output lines coupled between the anodes of the diodes and the transistors.

The positive D.C. power source V1 is coupled through lead 200 and a separate resistor 204 to each of the matrix output lines 74, 90, 102, 140, 178, and 188.

The decoder circuit 10 can be used to convert at least five different binary-coded decimal codes to pure decimal signals. These codes include that 8–4–2–1 code, cyclic 20 Gray code, Watts code, the 2–4–2–1 code, and the 5–4–2–1 code. The truth table for each of these codes is shown below. Each truth table shows the various combinations of code signals and the decimal equivalent for each.

| 8 | 4 | 2 | 1 | Decimal number |
|---|---|---|---|---|
| Code bits | | | | |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |

| Cyclic 20 Gray | | | | Decimal number |
|---|---|---|---|---|
| G4 | G3 | G2 | G1 | |
| Code bits | | | | |
| 1 | 0 | 1 | 0 | 0 |
| 1 | 1 | 1 | 0 | 1 |
| 1 | 1 | 1 | 1 | 2 |
| 1 | 1 | 0 | 1 | 3 |
| 1 | 1 | 0 | 0 | 4 |
| 0 | 1 | 0 | 0 | 5 |
| 0 | 1 | 0 | 1 | 6 |
| 0 | 1 | 1 | 1 | 7 |
| 0 | 1 | 1 | 0 | 8 |
| 0 | 0 | 1 | 0 | 9 |

| Watts | | | | Decimal number |
|---|---|---|---|---|
| G4 | G3 | G2 | G1 | |
| Code bits | | | | |
| 0 | 0 | 0 | 0 | 0 |
| 0 | 0 | 0 | 1 | 1 |
| 0 | 0 | 1 | 1 | 2 |
| 0 | 0 | 1 | 0 | 3 |
| 0 | 1 | 1 | 0 | 4 |
| 1 | 1 | 1 | 0 | 5 |
| 1 | 0 | 1 | 0 | 6 |
| 1 | 0 | 1 | 1 | 7 |
| 1 | 0 | 0 | 1 | 8 |
| 1 | 0 | 0 | 0 | 9 |

| 2 | 4 | 2′ | 1 | Decimal number |
|---|---|---|---|---|
| Code bits | | | | |
| 0 | 0 | 0 | 0 | 0 |
| 0 | 0 | 0 | 1 | 1 |
| 1 | 0 | 0 | 0 | 2 |
| 1 | 0 | 0 | 1 | 3 |
| 1 | 0 | 1 | 0 | 4 |
| 1 | 0 | 1 | 1 | 5 |
| 1 | 1 | 0 | 0 | 6 |
| 1 | 1 | 0 | 1 | 7 |
| 1 | 1 | 1 | 0 | 8 |
| 1 | 1 | 1 | 1 | 9 |

| 5 | 4 | 2 | 1 | Decimal number |
|---|---|---|---|---|
| Code bits | | | | |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 1 | 0 | 0 | 0 | 5 |
| 1 | 0 | 0 | 1 | 6 |
| 1 | 0 | 1 | 0 | 7 |
| 1 | 0 | 1 | 1 | 8 |
| 1 | 1 | 0 | 0 | 9 |

In order to utilize the circuit 10 convert the 8–4–2–1 code to pure decimal, the signal bits of the 8–4–2–1 binary-coded decimal signal are connected to the input terminals as follows:

the $\overline{2^0}$ bit is coupled to the terminal 190
the $2^0$ bit is coupled to the terminal 180
the $\overline{2^3}$ bit is coupled to the terminal 170
the $\overline{2^1}$ bit is coupled to the terminal 160
the $\overline{2^2}$ bit is coupled to the terminal 150
the $2^1$ bit is coupled to the terminal 130
the $2^2$ bit is coupled to the terminal 110
the $2^3$ bit is coupled to the terminal 78

It is understood that $\overline{2^0}$ is the complement of $2^0$ and $\overline{2^1}$ is complement of $2^1$, etc. In addition, logical 0 in the truth table represents a negative voltage, for example, −6 volts, and logical 1 represents a more positive voltage, for example, zero volts.

In the circuit 10, a current flow path is provided from the positive D.C. power source V1 through each of the resistors 204 and through each of the matrix output lines 74, 90, 102, 120, 140, 178, and 188 and through one of the transistors of each pair, depending on the state of the control transistors 25 and 25′. The presence or absence of each current flow in any of these seven matrix output lines is determined by the potential applied to the line by the combination of input signals appearing at the input to the diode matrix. If a negative potential appears on a matrix output line, then no current flows through it or either of the transitors to which it is connected. If a more positive potential appears on the line, then current can flow through this lead and through one of the transistors of the pair of transistors to which it is connected.

Assuming that the group of binary-coded decimal signal bits is applied representing decimal 0, then the 8, 4, 2, and 1 bits are logical zero which is −6 volts and their complements are logical 1 which is zero volts. This combination of signal bits turns on control transistor 25′. The other signal bits applied through the diode matrix product current flow only in line 140, and this current turns on transistor 24′ which in turn energizes cathode numeral "0" in tube 40.

The other combinations of signal bits in the 8–4–2–1 truth table, when applied to the input of the diode matrix, cause current to flow in one matrix output line. This one matrix output line energizes the transistor coupled to the glow cathode numeral representing the correct decimal number corresponding to the applied combination of signal bits.

In order to use the circuit 10 to perform the same decoding operation for the other codes, it is only necessary to (1) connect the signal bits to the proper input terminals and (2) connect the collector electrodes of the transistor pairs to the correct cathode electrodes in the indicator tube 40.

The following tables show the codes and the arrangement of their connections to the input terminals and the corresponding connections of the collectors of the transistors.

| Input Terminal | 5 4 2 1 Bit | Transistor | Cathode Numeral |
|---|---|---|---|
| 78 | 4 | 20 | 9 |
| 110 | 2 | 20′ | 4 |
| 130 | 1 | 21 | 7 |
| 150 | $\overline{2}$ | 21′ | 2 |
| 160 | $\overline{1}$ | 22 | 8 |
| 170 | $\overline{4}$ | 22′ | 3 |
| 180 | 5 | 23 | 6 |
| 190 | $\overline{5}$ | 23′ | 1 |
| | | 24 | 5 |
| | | 24′ | 0 |

| Input Terminal | Watts Bit | Transistor | Cathode Numeral |
|---|---|---|---|
| 78 | $G^3$ | 20 | 5 |
| 110 | $\overline{G^2}$ | 20′ | 4 |
| 130 | $G^1$ | 21 | 9 |
| 150 | $G^2$ | 21′ | 0 |
| 160 | $\overline{G^1}$ | 22 | 8 |
| 170 | $\overline{G^3}$ | 22′ | 1 |
| 180 | $G^4$ | 23 | 7 |
| 190 | $\overline{G^4}$ | 23′ | 2 |
| | | 24 | 6 |
| | | 24′ | 3 |

| Input Terminal | 2 4 2′1 Bit | Transistor | Cathode Numeral |
|---|---|---|---|
| 78 | $\overline{2}$ | 20 | 1 |
| 110 | 4 | 20′ | 0 |
| 130 | $2^1$ | 21 | 7 |
| 150 | $\overline{4}$ | 21′ | 6 |
| 160 | $\overline{2^1}$ | 22 | 9 |
| 170 | 2 | 22′ | 8 |
| 180 | 1 | 23 | 5 |
| 190 | 1 | 23′ | 4 |
| | | 24 | 3 |
| | | 24′ | 2 |

| Input Terminal | Cyclic 20 Gray bit | Transistor | Cathode Numeral |
|---|---|---|---|
| 78 | $\overline{G^3}$ | 20 | 9 |
| 110 | $\overline{G^2}$ | 20′ | 0 |
| 130 | $G^1$ | 21 | 5 |
| 150 | $G^2$ | 21′ | 4 |
| 160 | $\overline{G^1}$ | 22 | 6 |
| 170 | $G^3$ | 22′ | 3 |
| 180 | $\overline{G^4}$ | 23 | 7 |
| 190 | $G^4$ | 23′ | 2 |
| | | 24 | 8 |
| | | 24′ | 1 |

From the foregoing description, it can be seen that the circuit of the invention can be used to convert many binary-coded decimal codes to pure decimal code. It is noted that each such code which can be decoded has a biquinary characteristic which means that the truth table for the code includes one column of bits containing five logical zeroes and five logical ones. This column of signal bits is called the separator or control column and is used to operate the auxiliary transistors. In addition, an examination of the other rows and columns of bits shows that the rows of bits can be grouped into five pairs of identical rows of bits with one member of a pair being associated with a logical zero in the separator column and the other member of the pair being associated with a logical zero and one associated with a one in the separator column. Those skilled in the art will understand that this type of code produces a two-layer Veitch diagram which includes four signals in one layer and one signal in the other. Thus, it appears that there are many codes which satisfy these requirements and can be decoded by the circuit 10.

What is claimed is:

1. A decoder circuit including five pairs of transistors and a pair of auxiliary transistors, each of which is coupled to and controls the operation of one transistor of each pair of transistors, a diode matrix, eight input lines to said diode matrix, seven output lines from said diode matrix coupled to said transistors, and

*said diode matrix including* a two-diode AND gate in three of said seven lines, a three-diode AND gate in one of said lines, and a single diode in each of the remaining lines including the two lines coupled to said auxiliary transistors, there thus being four AND gates,

*each* [one] diode of each two-diode AND gate being connected to one diode of one other AND gate to form diode sub-pairs, two diodes of said three-diode AND gate being connected to diodes in separate two-diode AND gates, one diode of said three-diode AND gate thus not being connected to any other AND gate, a signal input terminal coupled to each of said sub-pairs of diodes and to the one diode in said *three-diode AND gate not connected to any other AND gate and to each of the single diodes coupled to said auxiliary transistors* [two AND gates which are not connected to diodes in other AND gates], said input terminals being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in another code.

2. A decoder circuit including five pairs of transistors and a pair of auxiliary transistors, each of which is coupled to and controls the operation of one transistor of each pair of transistors, a diode matrix, eight input lines to said diode matrix, seven output lines from said diode matrix with five lines of said seven lines coupled one to each of said five pairs of transistors and one line coupled to each of said auxiliary transistors, and

*said diode matrix including* a two-diode AND gate in three of said seven lines, a three-diode AND gate in one of said lines, and a single diode in each of the remaining lines including the two lines coupled to said auxiliary transistors, there thus being four AND gates,

*each* [one] diode of each two-diode AND gate being connected to one diode of one other AND gate to form diode sub-pairs, two diodes of said three-diode AND gate being connected to diodes in separate two-diode AND gates, one diode of said three-diode AND gate thus not being connected to any other AND gate, a signal input terminal coupled to each of said sub-pairs of diodes and to the one diode in said *three-diode AND gate not connected to any other AND gate and to each of the single diodes coupled to said auxiliary tranistors* [two AND gates which are not connected to diodes in other AND gates], said input terminals being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in another code.

3. A decoder circuit including five pairs of transistors and a pair of auxiliary transistors, each of which is coupled to and controls the operation of one transistor of each pair of transistors, a diode matrix, eight input lines to said diode matrix, seven output lines from said diode matrix and coupled to said transistors,

*three* [two] two-diode AND gates coupled by their anodes to three of said output lines,

*a three-diode AND gate coupled by the anode of each of its diodes to one of said output lines,*

*each* [one] diode of each of said *two-diode* [two] AND gates being coupled by its cathode to the cathode of another diode in one *other* of said [two] AND gates to form diode sub-pairs, *one diode of said three-diode AND gate being not connected to another diode,* a signal input terminal coupled to the joined cathodes of each diode sub-pair *and to said one diode of said three-diode AND gate,*

[a three-diode AND gate coupled by the anode of each of its diodes to one of said output lines,]

[two of the diodes of said three-diode AND gate being coupled by their cathodes to the cathodes of one diode in each of said two-diode AND gates to form two additional diode sub-pairs with an input terminal coupled to the joined cathodes of said two additional diode sub-pairs,]

and single diodes coupled by their anodes to three of said output lines with an input terminal connected to the cathode of each of said single diodes, two of said single diodes being coupled to said auxiliary transistors, said input terminals being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in another code.

4. The circuit defined in claim 3 and including a decimal display device coupled to said pairs of transistors to provide a visual display of the output signal which results from a signal decoding operation.

5. A circuit for use in decoding biquinary code signals comprising five pairs of decimal-representing transistors, two auxiliary control transistors, each coupled to and controlling the operation of one transistor of each pair of transistors, a diode matrix, eight input lines to said diode matrix, seven output lines from said diode matrix, said diode matrix including single diodes in three of said output lines, three two-diode AND gates in three of said output lines, and one three-diode AND gate in one of said output lines, said input lines being adapted to receive different combinations of signal bits in one code and providing current flow on one output line from the diode matrix to one of said pairs of transistors and to one of said auxiliary transistors whereby one transistor of one of said pairs of transistors is turned on and provides an output signal having a meaning in decimal code.

*6. A decoder circuit including*

*five pairs of semiconductor switching devices and a pair of auxiliary semiconductor switching devices, each of which is coupled to and controls the operation of one device of each pair of devices,*

*a diode matrix,*

*eight input lines to said diode matrix,*

*seven output lines from said diode matrix coupled to said devices, and*

*said diode matrix including a two-diode AND gate in three of said seven lines, a three-diode AND gate in one of said lines, and a single diode in each of the remaining lines including the two lines coupled to said auxiliary devices,*

*there thus being four AND gates,*

*each diode of each two-diode AND gate being connected to one diode of one other AND gate to form diode sub-pairs,*

*two diodes of said three-diode AND gate being connected to diodes in separate two-diode AND gates,*

*one diode of said three-diode AND gate thus not being connected to any other AND gate,*

*a signal input terminal coupled to each of said sub-pairs of diodes and to the one diode in said three-diode AND gate not connected to any other AND gate and to each of the single diodes coupled to said auxiliary devices,*

*said input terminals being adapted to receive different combinations of signal bits in one code and providing current flow on one output line from the diode matrix to one of said pairs of devices and to one of said auxiliary devices whereby one device of one of said pairs of devices is turned on and provides an output signal having a meaning in another code.*

*7. A decoder circuit including*

*first, second, third, fourth, and fifth pairs of semiconductor switching devices, each having an input electrode and an output electrode,*

*two auxiliary control semiconductor switching devices having input and output electrodes and each coupled to and controlling the operation of one device in each pair of devices,*

*a first input terminal connected through a first diode and a first input line to the input electrodes of said first pair of devices,*

*a second input terminal coupled through a second diode and a second input line to the input electrodes of said second pair of devices, said second input terminal also being coupled through a third diode and a third input line to the input electrodes of said third pair of devices,*

*a third input terminal coupled through a fourth diode and said third input line to the input electrodes of said third pair of devices, said third input terminal also being coupled through a fifth diode and a fourth input line to the input electrodes of said fourth pair of devices,*

*a fourth input terminal coupled through a sixth diode and said fourth input line to said fourth pair of devices, said fourth input terminal also being coupled through a seventh diode and a fifth input line to said fifth pair of devices,*

*a fifth input terminal coupled through an eighth diode and said second input line to said second pair of devices, said fifth input terminal also being coupled through a ninth diode and said fifth input line to said fifth pair of devices,*

*a sixth input terminal coupled through a tenth diode and said fifth input line to said fifth pair of devices,*

*a seventh input terminal coupled through an eleventh diode to the input of one of said auxiliary devices, and*

*an eighth input terminal coupled through a twelfth diode and a seventh input line to the input of the other auxiliary control device,*

*said input terminals being adapted to receive different combinations of signal bits in one code and providing current flow on one output line from the diode matrix to one of said pairs of devices and to one of said auxiliary devices whereby one device of one of*

*said pairs of devices is turned on and provides an output signal having a meaning in another code.*

References Cited

The following references, cited by the Examiner, are of record in the patented file of this patent or the original patent.

UNITED STATES PATENTS 3,086,198 4/1963 Tate ---------- 340—347

MAYNARD R. WILBUR, Primary Examiner

J. GLASSMAN, Assistant Examiner